US009722610B2

(12) United States Patent
Akahane

(10) Patent No.: US 9,722,610 B2
(45) Date of Patent: Aug. 1, 2017

(54) SEMICONDUCTOR DEVICE AND HIGH SIDE CIRCUIT DRIVE METHOD

(71) Applicant: FUJI ELECTRIC CO., LTD., Kawasaki-shi (JP)

(72) Inventor: Masashi Akahane, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 5 days.

(21) Appl. No.: 15/067,676

(22) Filed: Mar. 11, 2016

(65) Prior Publication Data
US 2016/0197614 A1 Jul. 7, 2016

Related U.S. Application Data

(60) Division of application No. 14/301,668, filed on Jun. 11, 2014, now Pat. No. 9,325,317, which is a (Continued)

(30) Foreign Application Priority Data

Feb. 28, 2012 (JP) ................................. 2012-042568

(51) Int. Cl.
*H03K 3/012* (2006.01)
*H03K 19/0185* (2006.01)
(Continued)

(52) U.S. Cl.
CPC ..... *H03K 19/018521* (2013.01); *H03K 3/012* (2013.01); *H03K 3/013* (2013.01);
(Continued)

(58) Field of Classification Search
CPC ........... H03K 19/018528; H03K 3/012; H03K 3/013; H03K 17/04123; H03K 17/08122;
(Continued)

(56) References Cited

U.S. PATENT DOCUMENTS 5,896,043 A 4/1999 Kumagai
5,917,359 A 6/1999 Fukunaga et al.
(Continued)

FOREIGN PATENT DOCUMENTS

JP 09200020 A 7/1997
JP 2000252809 A 9/2000
(Continued)

OTHER PUBLICATIONS

Extended European Search Report issued in European Patent Application No. 12869891.7, mailed Oct. 19, 2016.
(Continued)

*Primary Examiner* — Jung Kim
(74) *Attorney, Agent, or Firm* — Rossi, Kimms & McDowell LLP

(57) ABSTRACT

Aspects of the invention can include a pulse generating means that outputs a set signal and reset signal for driving the high potential side switching element is such that, while either one of the set signal or reset signal is in an on-state as a main pulse signal for putting the high potential side switching element into a conductive state or non-conductive state, the other signal is turned on a certain time after the rise of the main pulse signal, thereby generating a condition in which the set signal and reset signal are both in an on-state.

3 Claims, 12 Drawing Sheets

Related U.S. Application Data continuation of application No. PCT/JP2012/081414, filed on Dec. 4, 2012.

(51) Int. Cl.
| | | |
|---|---|---|
| *H03K 17/0412* | (2006.01) | |
| *H03K 17/0812* | (2006.01) | |
| *H03K 3/013* | (2006.01) | |
| *H03K 17/26* | (2006.01) | |
| *H02M 7/538* | (2007.01) | |
| *H02M 1/00* | (2006.01) | |

(52) U.S. Cl.
CPC . *H03K 17/04123* (2013.01); *H03K 17/08122* (2013.01); *H03K 17/26* (2013.01); *H03K 19/018528* (2013.01); *H02M 7/538* (2013.01); *H02M 2001/0054* (2013.01); *H03K 2217/0063* (2013.01); *H03K 2217/0081* (2013.01); *Y02B 70/1491* (2013.01)

(58) Field of Classification Search
CPC ... H03K 2217/0081; H03K 19/018521; H03K 17/26; H03K 2217/0063; H02M 7/538; H02M 2001/0054; Y02B 70/1491
See application file for complete search history.

(56) References Cited

U.S. PATENT DOCUMENTS

| | | | |
|---|---|---|---|
| 6,326,831 | B1 | 12/2001 | Kumagai |
| 8,044,699 | B1 | 10/2011 | Kelly |
| 8,299,836 | B2 | 10/2012 | Sakurai et al. |
| 8,405,422 | B2 | 3/2013 | Akahane |
| 8,686,785 | B2 * | 4/2014 | Koike ................ H03K 19/0944 326/62 |
| 2009/0256619 | A1 | 10/2009 | Hsu |

FOREIGN PATENT DOCUMENTS

| | | |
|---|---|---|
| JP | 3429937 B2 | 7/2003 |
| JP | 2008211337 A | 9/2008 |
| NO | 2012043750 A1 | 4/2012 |

OTHER PUBLICATIONS

International Search Report issued in Intl. Appln. No. PCT/JP2012/081414, mailed Jan. 8, 2013.

Notice of Allowance issued in U.S. Appl. No. 14/301,668, mailed Jan. 13, 2016.

* cited by examiner

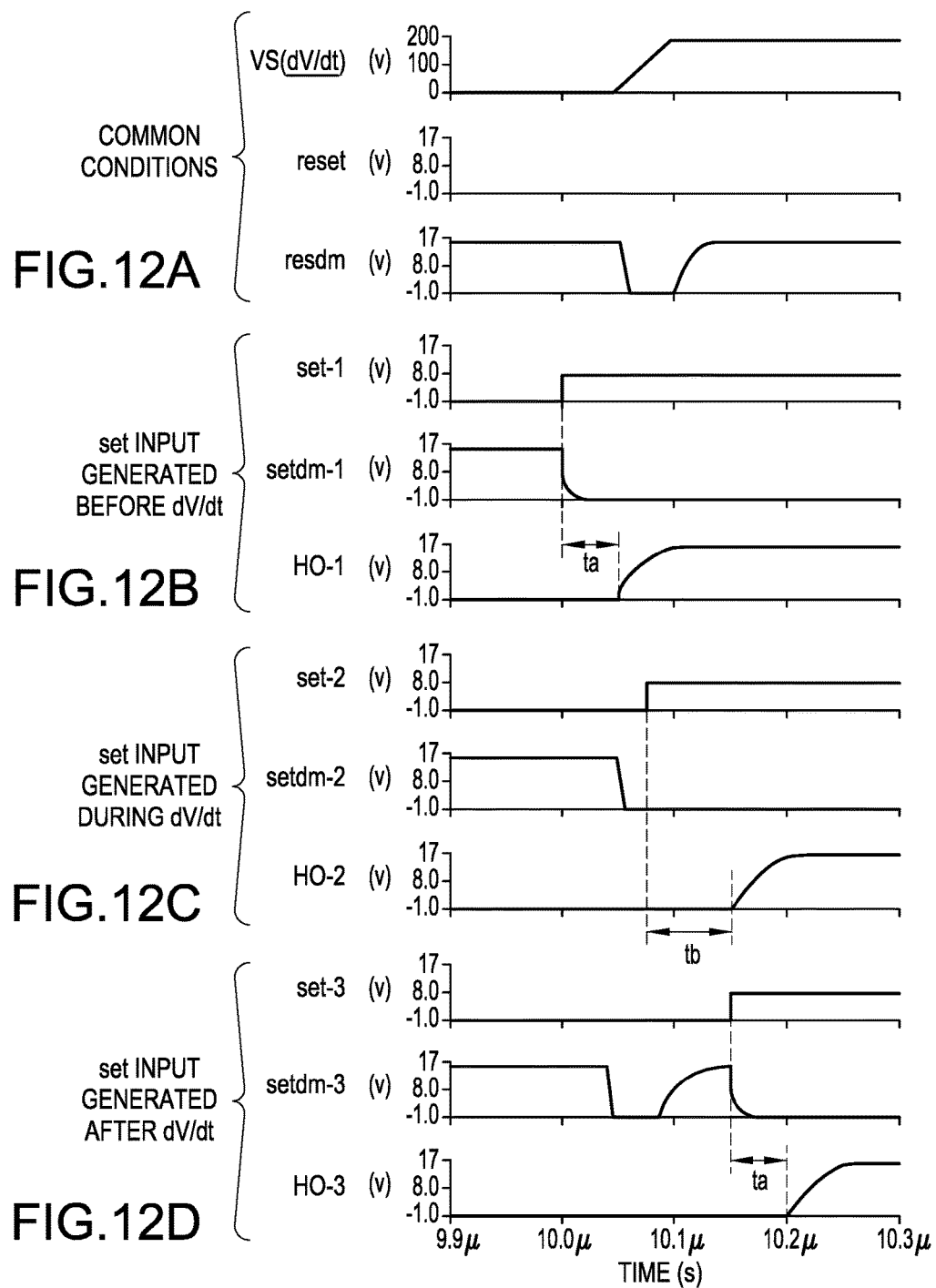
FIG.12A COMMON CONDITIONS
FIG.12B set INPUT GENERATED BEFORE dV/dt
FIG.12C set INPUT GENERATED DURING dV/dt
FIG.12D set INPUT GENERATED AFTER dV/dt

SEMICONDUCTOR DEVICE AND HIGH SIDE CIRCUIT DRIVE METHOD

CROSS-REFERENCE TO RELATED CASES

This application is a continuation of International Application No. PCT/JP2012/081414, filed on Dec. 4, 2012, which is based on and claims priority to Japanese Patent Application No. JP 2012-042568, filed on Feb. 28, 2012. The disclosure of the Japanese priority application and the PCT application in their entirety, including the drawings, claims, and the specification thereof, are incorporated herein by reference.

BACKGROUND

1. Field of the Invention

The present invention relates to a semiconductor device such as a half bridge drive circuit. In particular, the invention relates to a semiconductor device having a level shift circuit that transmits an input signal of a low potential system, which is a primary side system, to a high potential system, which is a secondary side system operating on a potential differing from the primary side operating potential, and to a high side circuit drive method.

2. Related Art

To date, a level shift circuit that transmits a low potential system control signal to a high potential system in order to drive a high potential side switching element has been used in a half bridge drive circuit, or the like, to which the power supply voltage of a high potential system power supply is applied.

Hereafter, using FIG. 10, a description will be given of a heretofore known half bridge drive circuit 90.

In FIG. 10, switching elements XD1 and XD2, such as IGBTs, are connected in a totem pole between a power supply potential E and a ground potential GND, configuring a half bridge circuit (an output circuit 10). Also, diodes DH and DL are connected in anti-parallel to the switching elements XD1 and XD2. Further, the configuration is such that an inductive load L1 is connected to a connection point P3 of the switching element XD1 and switching element XD2.

In FIG. 10, the switching element XD1 is an element that, with the potential of the connection point P3 with the switching element XD2 as a reference potential, carries out a switching operation between the reference potential and the power supply potential E, which is supplied by a power supply PS. In the following description, the switching element XD1 will be referred to as a high potential side switching element.

Also, the switching element XD2 is an element that, with the ground potential as a reference potential, carries out a switching operation between the reference potential and the potential of the connection point P3. In the following description, the switching element XD2 will be referred to as a low potential side switching element.

The heretofore known half bridge drive circuit 90 is configured of the output circuit 10 having the switching elements XD1 and XD2, a high side circuit 99 that drives the high potential side switching element XD1, and a low side circuit 30 that drives the low potential side switching element XD2. As the invention relates to the high side circuit, a description of the low side circuit will be omitted.

The high side circuit 99 includes a pulse generator circuit 40 that generates a pulse form set signal (set) and reset signal (reset) for controlling the turning on and off of the high potential side switching element XD1 in response to a low potential system input signal Hdrv provided from a microcomputer, or the like, provided on the exterior but not shown in FIG. 10. The high side circuit 99 also includes level shift circuits 24 and 25 that convert the set signal and reset signal output from the pulse generator circuit 40 to a high potential system signal level, a latch circuit 23 configured of an RS flip-flop, or the like, that latches the level-shifted set signal and reset signal, and a high side driver 21 that generates a gate signal of the high potential side switching element in accordance with the latched signal.

When taking the input signal to be of negative logic and the output signal to be of positive logic, the latch circuit 23 outputs at an H level when the input level-shifted set signal is at an L level (valid) and the level-shifted reset signal is at an H level (invalid), turning on the high potential side switching element XD1 via the high side driver 21, and putting the high potential side switching element XD1 into a conductive state. Also, the latch circuit 23 outputs at an L level when the input level-shifted set signal is at an H level (invalid) and the level-shifted reset signal is at an L level (valid), turning off the high potential side switching element XD1 via the high side driver 21, and putting the high potential side switching element XD1 into a non-conductive state.

When driving the switching elements XD1 and XD2, and supplying power to the inductive load L1, a potential Vs of the connection point P3 fluctuates, which may generate noise occurring because of a temporal change in voltage. In the following description, this noise will be referred to as dV/dt noise.

To date, circuits that combat malfunction due to the dV/dt noise have been proposed. For example, in Japanese Patent No. JP 3,429,937, a latch malfunction protection 22, which is a malfunction prevention circuit, is provided at a stage prior to the latch circuit in order to prevent malfunction of the latch circuit.

The malfunction prevention circuit being of the kind of circuit configuration shown in FIG. 11, when the level-shifted set signal and reset signal are both at an L level (valid), outputs the set signal and reset signal both at an H level (invalid) to the latch circuit 23. As the output of the latch circuit 23 is held because of this, it is possible to prevent malfunction due to dV/dt noise when the level-shifted set signal and reset signal are both transiently at an L level (valid).

However, the potential Vs of the connection point P3 normally rises when the switching element XD1 is switched from an off-state to an on-state and the switching element XD2 is switched from an on-state to an off-state, at which time dV/dt noise is generated. Alternatively, apart from this, the potential Vs may also rise, for example, in a dead time when the switching elements XD1 and XD2 are both in an off-state. This dead time is set in order to prevent a flow-through current from flowing.

That is, when the switching element XD2 is turned on, current flows from the load L1 into the output circuit 10, which is a converter component, and the switching element XD2 is turned off when the switching element XD2 is in a condition such that it is a current sink element, there is no longer a path for the current flowing from the load L1 in the dead time. Because of this, the parasitic capacitance of a potential Vs line connected to the connection point P3 is charged by the current, and the potential Vs rises swiftly. On the potential Vs rising to a voltage such as to turn on the diode DH connected in parallel to the switching element XD1, the diode DH is turned on, and current flows from the load L1 via the diode DH into the power supply PS, causing power loss. The voltage that turns on the diode DH is the sum of the output voltage E of the power supply PS and the forward voltage of the diode DH.

FIGS. 12A-12D show the relationship between the dead time, the output timing of the set signal, and the delay time of an output signal H0 from the high side driver 21.

In FIG. 12D, when a set signal (set-3) changes to an H level after the end of a rise of the potential Vs owing to dead time, or the like, the set signal (set-3) changes to an H level in a condition in which the latch malfunction protection function of the latch malfunction protection circuit 22 is not operating. Because of this, an output signal H0-3 of the high side driver 21 rises, delayed by a unique delay time ta, at the same time as which the switching element XD1 is turned on. The case shown in FIG. 12B where a set signal (set-1) changes to an H level before the rise of the potential Vs also has the same delay time ta.

However, in a case where a set signal (set-2) changes to an H level when the potential Vs is rising due to dead time or the like, that is, in a case where a period in which the potential Vs is rising and the point at which the set signal (set-2) changes to an H-level coincide, a blank period tb longer than the unique delay time ta occurs, as shown in FIG. 12C.

A level-shifted set signal (setdrn-2) and a level-shifted reset signal (resdrn) both change to an L level due to dV/dt noise generated in accompaniment to the rise of the potential Vs shown in FIG. 12C, and the set signal (set-2) changes to an H level while the protection function of the latch malfunction protection circuit 22 is in an operating condition. Because of this, the period in which dV/dt noise is generated ends. Further, the set signal (set-2) is not transmitted to the latch circuit 23 until the latch malfunction protection circuit 22 protection operation period ends. Because of this, an output signal H0-2 of the high side driver 21 rises after a long blank period (tb (>ta)).

As heretofore described, when the potential Vs rises in a dead time period or the like, an operation of turning on the switching element XD1 is delayed because of the blank period tb. Because of this, power loss due to the diode DH connected in parallel to the switching element XD1 becomes a problem. Consequently, there is a demand for technology whereby the switching element XD1 can be turned on as quickly as possible.

SUMMARY OF THE INVENTION

The invention, having been contrived bearing in mind the heretofore described situation, has an object of providing a semiconductor device and high side circuit drive method such that it is possible to reduce a delay in signal transmission by a circuit that prevents malfunction due to dV/dt noise of a high potential side switching element configuring a half bridge or the like.

In order to achieve the heretofore described object, a semiconductor device of the invention, being a semiconductor device that transmits a primary side potential system input signal to a secondary side potential system differing from the primary side potential system, is characterized by including a high potential side switching element operating on a secondary side potential system control signal and a low potential side switching element operating on a primary side potential system control signal, connected in series, and power supply means having the potential of a connection point of the high potential side switching element and low potential side switching element as a reference, pulse generating means that, based on the input signal, generates a pulse form set signal for putting the high potential side switching element into a conductive state and a pulse form reset signal for putting the high potential side switching element into a non-conductive state, first level shifting means, in which a first resistor and first switching element are connected in series between a secondary side potential system high potential side power supply potential and a primary side potential system low potential side power supply potential, that provides the set signal as a gate signal of the first switching element, and obtains a secondary side potential system level-shifted set signal from a first connection point, which is a connection point of the first resistor and first switching element, second level shifting means, in which a second resistor and second switching element are connected in series between the secondary side potential system high potential side power supply potential and primary side potential system low potential side power supply potential, that provides the reset signal as a gate signal of the second switching element, and obtains a secondary side potential system level-shifted reset signal from a second connection point, which is a connection point of the second resistor and second switching element, control signal output means that, based on the level-shifted set signal and level-shifted reset signal, outputs a control signal maintaining the high potential side switching element in a conductive state or non-conductive state, protection means provided in a stage prior to the control signal output means that, when the level-shifted set signal and level-shifted reset signal are provided simultaneously, provides a predetermined signal to the control signal output means such that the output of the immediately preceding control signal is continued, a third switching element connected in parallel with the first resistor, a fourth switching element connected in parallel with the second resistor, and logical gate means, operating on the secondary side potential system, into which the potentials of the first and second connection points are input, in which the logical gate means, when the potentials of the first and second connection points are both lower than the input threshold voltage of the logical gate means, puts the third and fourth switching elements into a conductive state.

The invention is such that a condition in which the protection means is functioning is detected by the output of the level shifting means being monitored by the logical gate means. Further, by the third and fourth switching elements being turned on when the protection means is functioning, the protection function operating time is shortened, enabling a high speed operation.

Also, the semiconductor device of the invention is characterized by including feedback means that pulls down the first connection point and pulls up the second connection point when the high potential side switching element is in a conductive state, and pulls up the first connection point and pulls down the second connection point when the high potential side switching element is in a non-conductive state.

By providing the feedback means according to the invention, a stable operation and high speed operation are possible when dV/dt noise is generated.

Also, the pulse generating means of the semiconductor device of the invention is characterized by, while either one of the set signal or reset signal is in an on-state as a main pulse signal for putting the high potential side switching element into a conductive state or non-conductive state, turning on the other signal a certain time after the rise of the main pulse signal, thereby generating a condition in which the set signal and reset signal are both in an on-state.

According to the invention, a high speed operation of the semiconductor device is enabled by the protection function being constantly in an operating condition, and the third and fourth switching elements being caused to operate, regardless of whether or not dV/dt noise is generated.

Also, a high side circuit drive method according to the invention is a high side circuit drive method for transmitting a low potential system input signal to a high potential system, characterized by including a pulse generation circuit that generates a set signal, which is a differential pulse becoming dominant from the rising edge of an input low potential system control signal, and a reset signal, which is a differential pulse becoming dominant from the falling edge of the low potential system control signal, a first level shift circuit configured by an n-type channel switching element, turned on and off in accordance with the set signal, and a resistance element being connected in series, and a second level shift circuit configured by an n-type channel switching element, turned on and off in accordance with the reset signal, and a resistance element being connected in series, a latch circuit for holding a high side circuit output condition from an output value of the first level shift circuit and an output value of the second level shift circuit, a driver circuit that generates a signal driving a high potential side switching element based on an output of the latch circuit, and a latch malfunction protection circuit that arranges so that a predetermined condition of the output values of the first and second level shift circuits is not transmitted to a latch input, in which a logical sum circuit having each of the output values of the first and second level shift circuits as inputs, a first p-type channel semiconductor element, the source terminal of which is connected to a high side circuit high potential side power supply potential and the drain terminal of which is connected to the output of the first level shift circuit, and a second p-type channel semiconductor element, the source terminal of which is connected to the high side circuit high potential side power supply potential and the drain terminal of which is connected to the output of the second level shift circuit, are provided, the output terminal of the logical sum circuit is connected to the gate terminals of the first and second p-type channel semiconductor elements, and the set signal and reset signal of the pulse generator circuit are both put at an H level for a certain period by, when one differential pulse, which is dominant, of the pulse generator circuit is generated, the other differential pulse, the output of which is secondary, being output a certain time after the generation of the dominant differential pulse.

The invention is such that, in the pulse generator circuit that generates differential pulses of a control signal for controlling the turning on and off of the high potential side switching element, the differential pulse for driving the high potential side switching element is taken to be the dominant pulse. A certain time after the dominant differential pulse is output from one output terminal, the secondary differential pulse is output from the other output terminal. The secondary differential pulse does not directly control the turning on and off of the high potential side switching element. That is, the secondary differential pulse accelerates the return of the level-shifted set signal and reset signal. Because of this, a high speed operation of the high potential side switching element is possible.

By regulating the output time of the secondary differential pulse, the gate voltages of the first and second p-type channel semiconductor elements are controlled by utilizing the output signal of the logical sum circuit, the pulse output time for which both differential pulse outputs of the pulse generator circuit are at an H level is regulated, and the gate voltage of the first and second p-type channel semiconductor elements is regulated so as to exceed the operating threshold voltage of the first and second p-type channel semiconductor elements.

As heretofore described, according to the invention, it is possible to suppress a delay when there is dead time, or the like, in an operation of turning on a high potential side switching element of a semiconductor device configuring a half bridge or the like, and thus possible to reduce power loss due to a diode connected in parallel to the switching element.

BRIEF DESCRIPTION OF THE DRAWINGS

FIGS. 12A-12D are a timing chart for illustrating actions of a high side circuit of FIG. 10.

DETAILED DESCRIPTION

Figure 1:
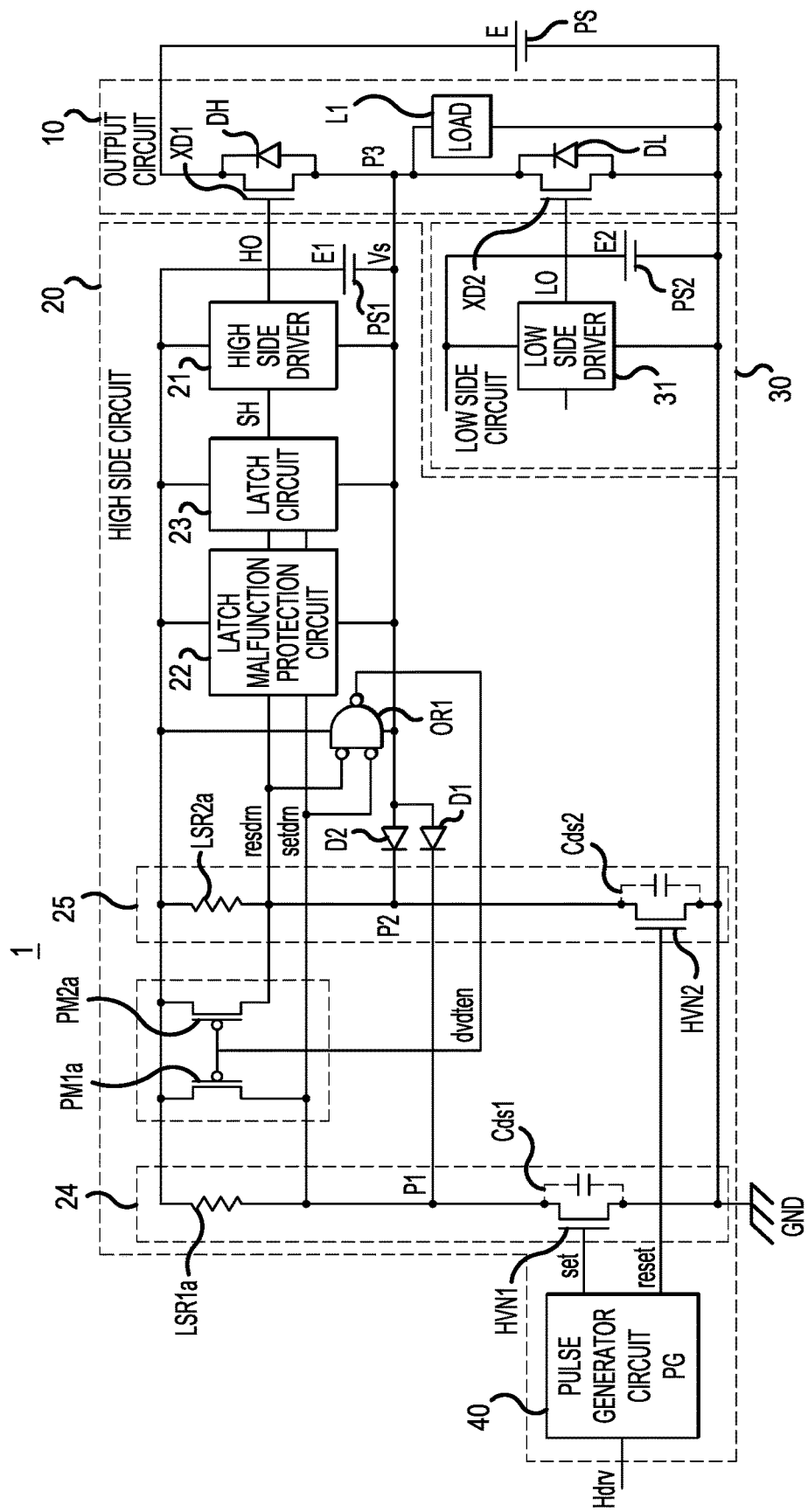
FIG. 1 is a circuit configuration diagram of a semiconductor device (half-bridge drive circuit) using a high side circuit according to a first embodiment of the invention.

Hereafter, a description will be given, referring to the drawings, of a semiconductor device and high side circuit drive method according to embodiments of the invention. The examples shown below are preferred, specific examples of a semiconductor device and high side circuit drive method of the invention, and various technologically preferable limitations may be imposed. The technological range of the invention is not limited to these aspects, provided that there is no description particularly limiting the invention. Also, components in the embodiments shown hereafter can be replaced with existing components as appropriate, and various variations including combinations with other existing components are possible. Consequently, the details of the invention described in the claims are not limited by the descriptions of the embodiments shown hereafter.

First Embodiment

FIG. 1 shows a configuration of a half-bridge drive circuit as one example of a semiconductor device according to the invention. A half-bridge drive circuit 1 is configured of a high side circuit 20 and a low side circuit 30. However as the invention relates to the high side circuit 20, and the relationship thereof with the low side circuit 30 is weak, a description of the low side circuit 30 will be abbreviated.

In FIG. 1, an output circuit 10 includes switching elements XD1 and XD2 connected in a totem pole configuring a half-bridge, and an output voltage E of a high voltage power supply PS is applied to either end thereof. For example, an n-type channel or p-type channel MOS transistor, a p-type or n-type IGBT, or the like, is used for the high potential side (high side) switching element XD1. For example, an n-type channel MOS transistor, an n-type IGBT, or the like, is used for the low potential side (low side) switching element XD2. Herein, n-type channel MOS transistors or n-type IGBTs are applied as the switching elements XD1 and XD2. Diodes DH and DL are connected in anti-parallel to the switching elements XD1 and XD2 respectively. The diodes DH and DL are commutating diodes or parasitic diodes.

The high side circuit 20 includes a pulse generator circuit 40 that, based on a command Hdrv from a microprocessor (not shown), outputs a set signal (set) turning on the high potential side switching element XD1 and a reset signal (reset) turning off the high potential side switching element XD1, level shift circuits 24 and 25 that shift the level of the set signal (set) and reset signal (reset), which are low potential system signals, output from the pulse generator circuit 40 to a high potential system, a high side driver 21 that receives an output of the level shift circuits 24 and 25 and controls the turning on and off of the switching element XD1, and a power supply PS1.

The level shift circuit 24 is configured of the turn-on signal side level shift circuit 24, which is formed of a resistor LSR1a and an n-type channel MOS transistor HVN1 and converts the level of the set signal (set) output from the pulse generator circuit 40 to that of a high potential system signal, and the turn-off signal side level shift circuit 25, which is formed of a resistor LSR2a and an n-type channel MOS transistor HVN2 and converts the level of the reset signal (reset) output from the pulse generator circuit 40 to that of a high potential system signal.

Also, one input terminal of a latch malfunction protection circuit 22 is connected to a first connection point P1, which is a series connection point of the turn-on signal side level shift circuit 24. The other input terminal is connected to a second connection point P2, which is a series connection point of the turn-off signal side level shift circuit.

The high side circuit 20 is such that an output signal SH of a latch circuit 23 is input into the high side driver 21 as a level-shifted signal. The output terminal of the high side driver 21 is connected to the gate terminal of the high potential side switching element XD1.

Also, the low potential side power supply terminals of the latch malfunction protection circuit 22, latch circuit 23, high side driver 21, and power supply PS1 are connected to a third connection point P3, which is a series connection point of the switching elements XD1 and XD2. The latch malfunction protection circuit 22, latch circuit 23, and high side driver 21 configure control signal output means 28. An output voltage E1 of the power supply PS1 is applied to each of the circuits 21 to 23.

The turn-on signal side level shift circuit 24, formed of the resistor LSR1a and transistor HVN1, and the turn-off signal side level shift circuit 25, formed of the resistor LSR2a and transistor HVN2, are each connected between the high potential side power supply potential E1 of the power supply PS1 and a ground (GND) potential.

The set signal (set) and reset signal (reset), which are input signals for the level shift circuits 24 and 25, are input into the gate terminals of the n-type channel MOS transistors HVN1 and HVN2 respectively. The set signal (set) and reset signal (reset) are low potential system signals.

The set signal (set) is a signal indicating the timing of the start of an on-state period, or end of an off-state period, of the high potential side switching element XD1. Also, the reset signal (reset) is a signal indicating the timing of the start of an off-state period, or end of an on-state period, of the switching element XD1.

The anodes of diodes D1 and D2 are both connected to the third connection point P3, while the cathodes are connected to the first connection point P1 and second connection point P2 respectively. The diodes D1 and D2 clamp so that a level-shifted set signal (setdrn) and a level-shifted reset signal (resdrn) output from the first and second connection points P1 and P2 do not fall to or below a potential Vs of the third connection point P3. That is, the diodes D1 and D2 are provided with the object of preventing an overvoltage from being input into the latch malfunction protection circuit 22.

The low side circuit 30 includes a low side driver 31, which controls the turning on and off of the low potential side switching element XD2, and a power supply PS2 that applies a power supply voltage E2 to the low side driver 31. The low side driver 31 amplifies an input signal, and inputs it into the gate terminal of the switching element XD2. The switching element XD2 is turned on when the signal input into the low side driver 31 is at an H level, and turned off when the signal is at an L level.

In a condition in which the protection function of the latch malfunction protection circuit 22 is not operating, the latch circuit 23 latches an H level for a period from the point at which the level-shifted set signal (setdrn) changes to an L level until the point at which the level-shifted reset signal (resdrn) changes to an L level. The switching element XD1 is turned on by a signal H0 output from the high side driver 21 in this latching period.

The switching elements XD1 and XD2 are turned on and off in a complementary way, except for a dead time when both are turned off. That is, the switching elements XD1 and XD2 are such that when one is in an on-state, the other is in an off-state. Further, the potential Vs of the third connection point P3 is practically at the ground potential when the switching element XD2 is in an on-state. Consequently, the potential Vs is practically equivalent to the output voltage E of the high voltage power supply PS when the switching element XD1 is in an on-state.

An inductive load L1 is connected between the third connection point P3 and the ground, and is driven by power output from the connection point P3.

Heretofore known technology is applied for the latch malfunction protection circuit 22. Herein, using FIG. 11, a description will be given of the configuration of the latch malfunction protection circuit 22.

Figure 11:
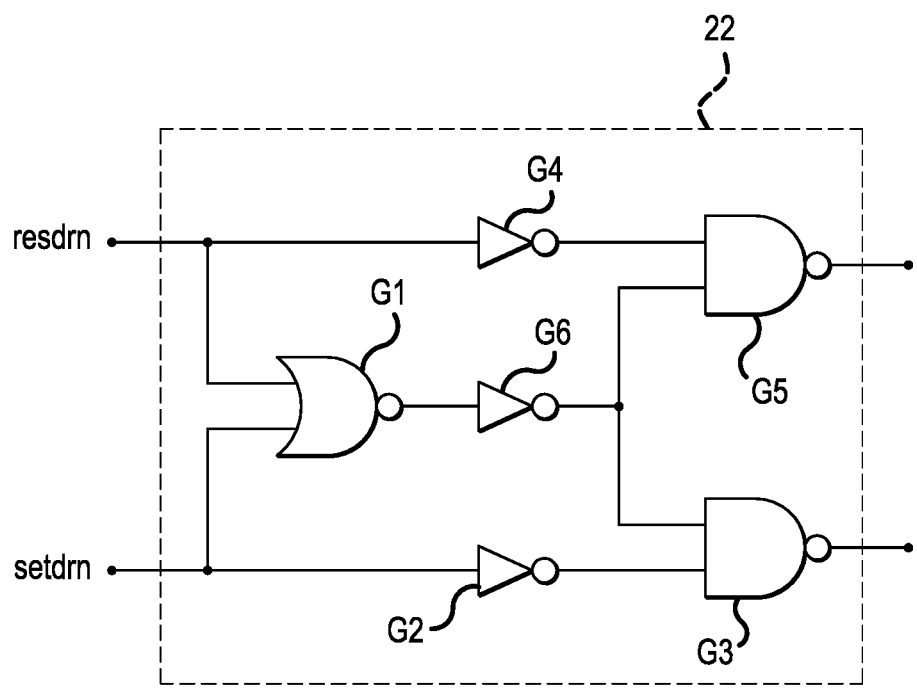
FIG. 11 is a circuit diagram of a heretofore known malfunction prevention circuit.

In the latch malfunction protection circuit 22 of FIG. 11, one input terminal, into which the level-shifted set signal (setdrn) is input, is connected to one input terminal of a NOR circuit G1, and connected via a NOT circuit G2 to one input terminal of a NAND circuit G3. Also, the other input terminal, into which the level-shifted reset signal (resdrn) is input, is connected to the other input terminal of the NOR circuit G1, and connected via a NOT circuit G4 to one input terminal of a NAND circuit G5. Further, the output terminal of the NOR circuit G1 is connected via a NOT circuit G6 to the other input terminal of the NAND circuit G3 and the other input terminal of the NAND circuit G5.

Figure 10:
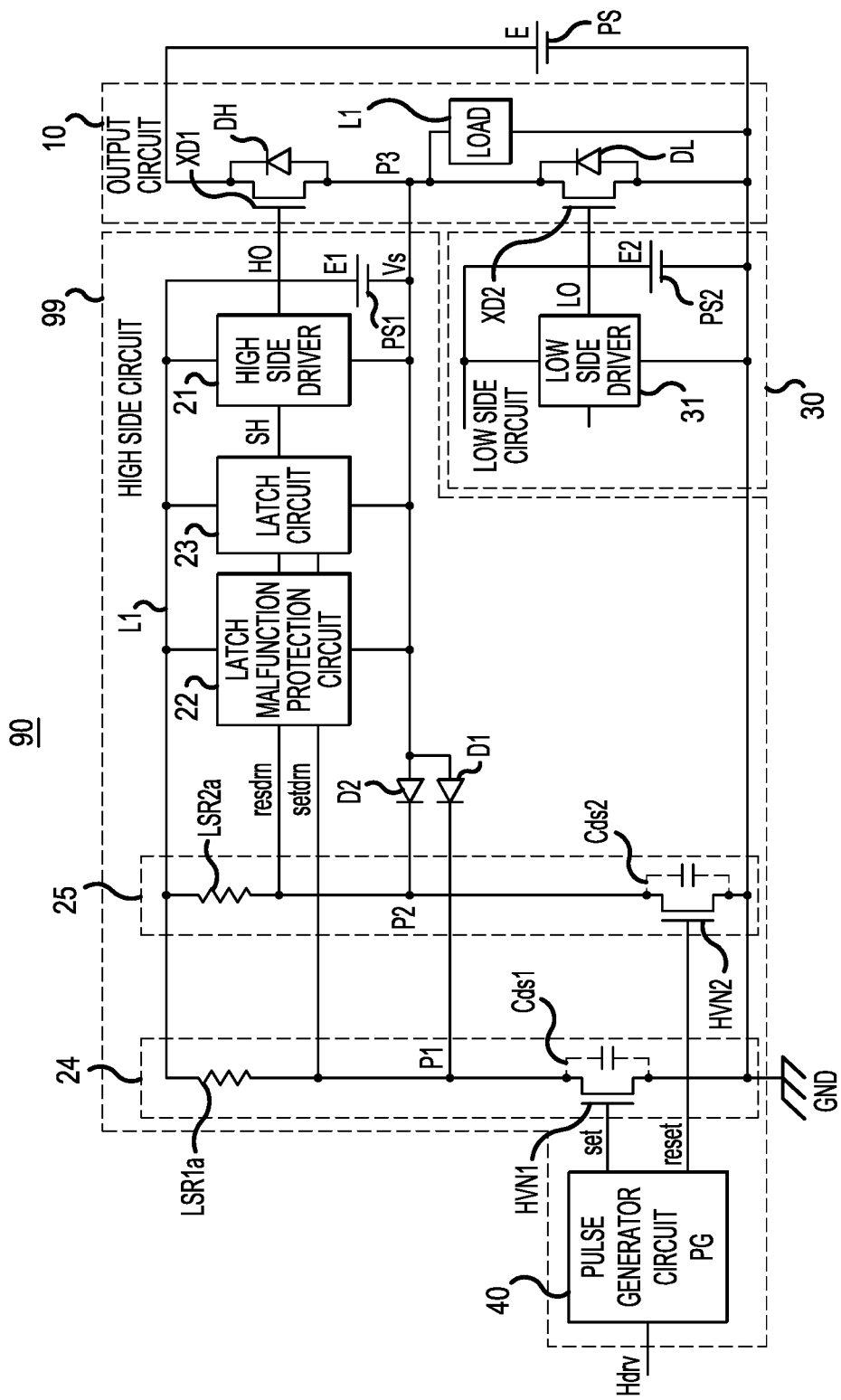
FIG. 10 is a circuit configuration diagram of a heretofore known half bridge drive circuit 90.

Returning to FIG. 1, the high side circuit 20 according to this embodiment has the configuration of a high side circuit 99 of a heretofore known example shown in FIG. 10, to which p-type channel MOS transistors PM1a and PM2a and a two-input logical sum circuit OR1, which is a logical gate circuit, have been added.

The transistors PM1a and PM2a are connected in parallel to the resistors LSR1a and LSR2a respectively. One input terminal of the logical sum circuit OR1 is connected to the first connection point P1, while the other input terminal is connected to the second connection point P2. Also, the output terminal of the logical sum circuit OR1 is connected to the gate terminals of the MOS transistors PM1a and PM2a. Further, the input threshold voltage of the logical sum circuit OR1 is set to be equal to or lower than the threshold voltage of the latch malfunction protection circuit 22.

Figure 2:
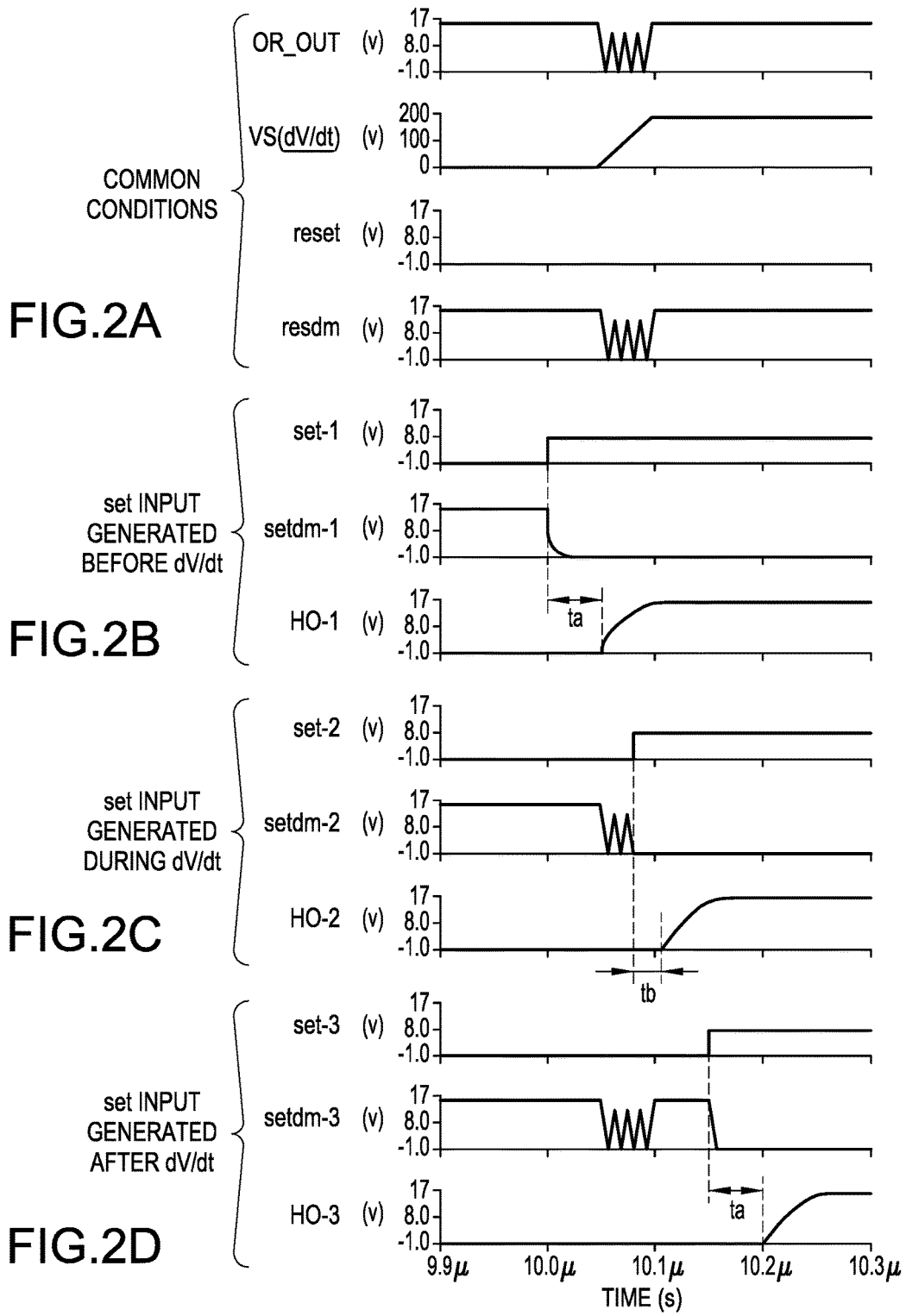
FIGS. 2A-2D are a timing chart for illustrating actions of the high side circuit of FIG. 1.

Hereafter, a description will be given of actions of the half bridge drive circuit according to this embodiment with reference to FIG. 2, which corresponds to FIG. 12.

On a set signal (set-1) changing to an H level, as shown in FIGS. 2A-2D, the n-type channel MOS transistor HVN1 is turned on. Then, an L level level-shifted set signal (setdrn-1) is output from the connection point P1. In this case, the latch malfunction protection function of the latch malfunction protection circuit 22 does not operate. Because of this, the latch circuit 23 carries out a latching operation. As a result of this, an output signal H0-1 of the high side driver 21 rises, delayed by a unique delay time ta, and the high potential side switching element XD1 is turned on.

On the switching element XD1 being turned on, the potential of the level-shifted reset signal (resdrn) drops due to dV/dt noise generated in accompaniment to a rise in the potential Vs. Then, on the potential of the level-shifted reset signal (resdrn) dropping to or below the threshold voltage of the logical sum circuit OR1, an output signal OR_OUT of the logical sum circuit OR1 changes to an L level, because the level-shifted set signal (setdrn-1), which is another input into the logical sum circuit OR1, is already at an L level. Because of this, the MOS transistors PM1a and PM2a are turned on, and the source-to-drain impedance of the MOS transistors PM1a and PM2a drops. This drop in impedance compensates for the drop in the voltage of the level-shifted set signal (setdrn-1) and level-shifted reset signal (resdrn). Because of this, the potential of the level-shifted set signal (setdrn-1) and level-shifted reset signal (resdrn) rises. FIG. 2 shows a case where the on-state resistance of the n-type channel MOS transistors HVN1 and HVN2 is set to be considerably lower than the on-state resistance of the MOS transistors PM1a and PM2a, and the level-shifted set signal (setdrn-1) when the n-type channel MOS transistor HVN1 is turned on by the set signal (set-1) does not oscillate, remaining at an L level.

On the potential of the level-shifted set signal (setdrn-1) and level-shifted reset signal (resdrn) rising, and exceeding the threshold voltage of the logical sum circuit OR1, the output terminal of the logical sum circuit OR1 changes to an H level. As a result of this, the gates of the MOS transistors PM1a and PM2a are turned off, and the source-to drain impedance thereof increases. Because of this, the potential of the level-shifted set signal (setdrn-1) and level-shifted reset signal (resdrn) falls.

As these actions are carried out repeatedly while dV/dt noise is being generated, the output signal of the logical sum circuit OR1, the level-shifted set signal (setdrn-1), and the level-shifted reset signal (resdrn) have an oscillating waveform. As heretofore described, the oscillation of the level-shifted set signal (setdrn-1) stops on the n-type channel MOS transistor HVN1 being turned on.

Next, a description will be given of a case where a set signal (set-2) changes to an H level when the potential Vs is rising due to the dead time, or the like, that is, a case where a period during which the potential Vs rises and a point at which the set signal (set-2) changes to an H level coincide. Herein, the two level-shifted signals (setdrn-1 and resdrn) are either both at an L level or both at an H level until the set signal (set-2) changes to an H level, because of which, there is no change in the latch circuit 23. That is, in the event that both signals are at an L level, input into the latch circuit 23 is impeded by the latch malfunction protection circuit 22, and in the event that both signals are at an H level, the input of the latch circuit 23 has negative logic, because of which, the latch circuit 23 does not change.

In this case, when dV/dt noise is being generated in accompaniment to the rise in the potential Vs, that is, under a condition in which the output signal of the logical sum circuit OR1 and the two level-shifted signals (setdrn-2 and resdrn) exhibit an oscillating waveform, the set signal (set-2) changes to an H level. On the set signal (set-2) changing to an H level, the n-type channel MOS transistor HVN1, which configures a set side source-grounded amplifier circuit, is turned on. Then, the level-shifted set signal (setdrn-2) changes to an L level. Because of this, input into the latch circuit 23 is not impeded by the latch malfunction protection circuit 22 at the timing at which the level-shifted reset signal (resdrn) changes to an H level due to oscillation, even when dV/dt noise is being generated. Consequently, it is possible to transmit the set signal (set-2) to the latch circuit 23.

In the event that a set signal (set-3) changes to an H level after the rise in the potential Vs due to the dead time, or the like, has ended, the latch malfunction protection function of the latch malfunction protection circuit 22 is not operating. Because of this, an output signal H0-3 of the high side driver 21 rises, delayed by the unique delay time ta, at the same time as which the switching element XD1 is turned on.

A description has been given of the above embodiment for a case where the set signal changes to an H level, but when the reset signal (reset) is changed to an H level too, the reset signal (reset) is transmitted to the latch circuit 23 in the same way.

According to this embodiment, as is clear from a comparison of an output signal H0-2 shown in FIGS. 2A-2D and the output signal H0-2 shown in FIG. 12, it is possible to suppress a delay of the output signal H0-2 in a condition in which the set signal (set-2) changes to an H level when the potential Vs is rising. Consequently, it is possible to suppress a delay in the action of turning on the switching element XD1, thus reducing power loss caused by the diode DH connected in parallel to the switching element XD1.

Also, in this embodiment, it is possible to use a circuit with the configuration shown in FIG. 11 as the latch malfunction protection circuit 22, and to use a set-reset flip-flop circuit as the latch circuit 23 combined with the latch malfunction protection circuit 22.

Also, it being sufficient that the logical sum circuit OR1 is a circuit that realizes the heretofore described actions, it is not limited to a simple logical sum circuit (OR gate circuit). The same also applies in the following embodiments.

Second Embodiment

Next, a description will be given of a second embodiment of the invention.

Figure 3:
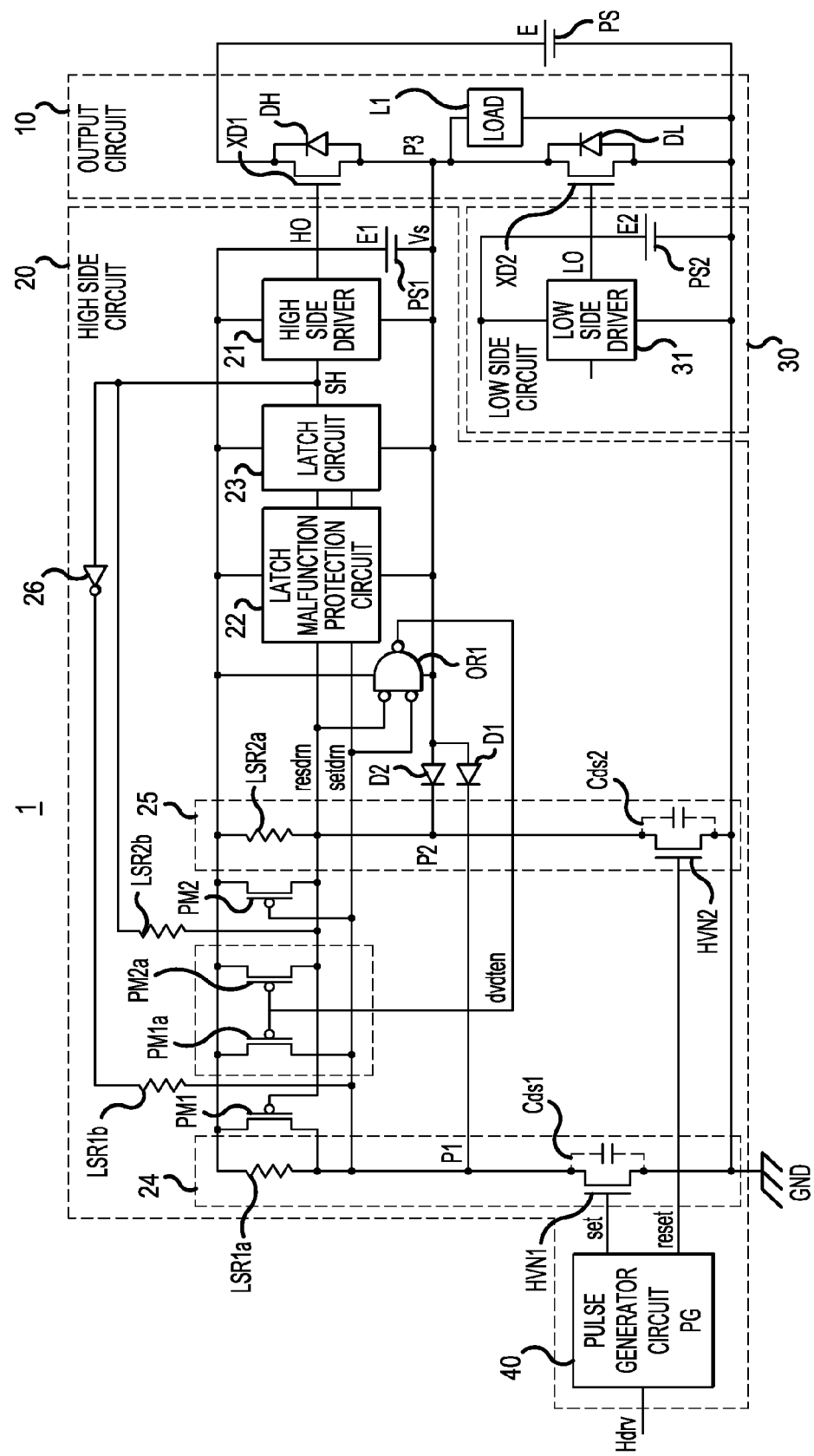
FIG. 3 is a circuit configuration diagram of a semiconductor device (half-bridge drive circuit) using a high side circuit according to a second embodiment of the invention.

FIG. 3 shows a configuration of a half-bridge drive circuit including a high side circuit according to this embodiment. A difference from FIG. 1 is that p-type channel MOS transistors PM1 and PM2, resistors LSR1b and LSR2b, and a NOT circuit 26 have been added. As the remainder is the same as FIG. 1, the same reference signs are given to the same components, and a description will be omitted.

The MOS transistors PM1 and PM2 are connected in parallel to the resistors LSR1a and LSR2a respectively, and the gate terminals thereof are connected to the connection points P2 and P1 respectively.

One end of the resistor LSR1b is connected to the connection point P1, while the other end is connected to the output terminal of the NOT circuit 26. Also, one end of the resistor LSR2b is connected to the connection point P2, while the other end is connected to the output terminal of the latch circuit 23. The input terminal of the NOT circuit 26 is also connected to the output terminal of the latch circuit 23.

The resistors LSR1b and LSR2b, NOT circuit 26, and transistors PM1 and PM2 configure a feedback circuit. The resistors LSR1a and LSR2a have the same resistance value, and the resistors LSR1b and LSR2b have the same resistance value.

Next, a description will be given of the resistors LSR1b and LSR2b.

In FIG. 3, the potentials of the terminals of the resistors LSR1b and LSR2b on the NOT circuit 26 side are such that when one is at an H level, the other is at an L level, in accordance with the logic level of the output signal from the latch circuit 23.

Herein, it is assumed that the output of the latch circuit 23 is at an L level. At this time, the output of the NOT circuit 26 is at an H level. Further, the potential of the level-shifted set signal (setdrn) output from the first connection point P1, being equivalent to the voltage E1 with the potential Vs as a reference, is at an H level. Meanwhile, the potential of the level-shifted reset signal (resdrn) output from the second connection point P2 is the value of the voltage E1 divided by the resistors LSR2a and LSR2b (=E1·LSR2b/(LSR2a+LSR2b)).

At this time, setting is carried out so that the divided voltage value is at the H level of the latch malfunction protection circuit 22. That is, the voltage division ratio of the resistors LSR2a and LSR2b is fixed so that the voltage in which the voltage E1 is divided by the resistors LSR2a and LSR2b is higher than the threshold voltage of the latch malfunction protection circuit 22.

The same applies when the output of the latch circuit 23 is at an H level, and the output of the NOT circuit 26 at an L level. That is, the voltage division ratio of the resistors LSR1a and LSR1b is fixed so that the voltage in which the voltage E1 is divided by the resistors LSR1a and LSR1b is at the H level of the latch malfunction protection circuit 22.

By fixing the voltage division ratio of the resistors LSR1a and LSR1b and the voltage division ratio of the resistors LSR2a and LSR2b in this way, there is an increase in the dV/dt noise resistance of the high side circuit 20 when only one input signal of the level-shifted set signal (setdrn) and level-shifted reset signal (resdrn) is input at an L level, and stable operation is possible.

Next, a description will be given of the feedback circuit formed of the resistors LSR1b and LSR2b, NOT circuit 26, and p-type channel MOS transistors PM1 and PM2.

It is assumed that the resistance values of the resistors LSR1a and LSR2a are equal and the resistance values of the resistors LSR1b and LSR2b are equal, and that the on-state resistance of the p-type channel MOS transistors PM1 and PM2 is sufficiently low. Then, the gate-to-source voltage of the p-type channel MOS transistor whose gate is connected to the H level connection point of the connection points P1 and P2 (in the following description, this connection point is referred to as the "H connection point") is zero. Also, the gate-to-source voltage of the p-type channel MOS transistor whose gate is connected to the L level connection point of the connection points P1 and P2 (in the following description, this connection point is referred to as the "L connection point") is E1·Ra/(Ra+Rb). A resistance Ra corresponds to either the resistor LSR1a or the resistor LSR2a, while a resistance Rb corresponds to either the resistor LSR1b or the resistor LSR2b.

The value of the gate-to-source voltage E1·Ra/(Ra+Rb) is set to a voltage value slightly higher than the threshold voltage of the p-type channel MOS transistors PM1 and PM2. Because of this, the MOS transistor whose gate is connected to the L connection point has a limited on-state resistance Ron, and the on-state resistance Ron is of a configuration in which it is connected in parallel to the resistor LSR1a or the resistor LSR2a. For example, when assuming that E1=15 V, the threshold voltage of the p-type channel MOS transistors PM1 and PM2 is 2.5 V, LSR1a=LSR2a=Ra=10 kΩ, and LSR1b=R5=Rb=45 kΩ, the gate-to-source voltage is 0.2 V higher than the threshold voltage at E1·Ra/(Ra+Rb)=2.7 V.

In this way, in this embodiment, the on-state resistance Ron is of a limited value that is not zero. Because of this, in this embodiment, a flow-through current is prevented from flowing between the potential E1 and ground potential, even when the n-type channel MOS transistor HVN1 or HVN2 connected to the H connection point is in an on-state.

Also, parasitic capacitors Cds1 and Cds2 exist between the source and drain of the n-type channel MOS transistors HVN1 and HVN2. Because of this, the on-state resistance Ron causes a difference between a time constant with respect to the H connection point and a time constant with respect to the L connection point, causing the former time constant to be smaller than the latter time constant.

As a result of this, when the potentials of the H connection point and L connection point change due to dV/dt noise, the potential of the H connection point changes more quickly than the potential of the L connection point. Consequently, when both potentials rise, a difference occurs between the time in which the potential of the H connection point reaches the input threshold voltage of the latch malfunction protection circuit 22 and the time in which the potential of the L connection point reaches the same threshold voltage. The latch circuit 23 is set or reset so as to eventually maintain the original value, based on the time difference.

Therefore, according to this embodiment, it is possible to more reliably prevent malfunction with respect to dV/dt noise.

As heretofore described, the feedback circuit formed of the resistors LSR1b and LSR2b, NOT circuit 26, and p-type channel MOS transistors PM1 and PM2 pulls up one of the first connection point P1 and second connection point P2 to the secondary side potential system high potential side power supply potential, and pulls down the other to the secondary side potential system low potential side power supply potential, in response to the output signal of the latch circuit 23, because of which, malfunction with respect to dV/dt noise is more reliably prevented.

With the high side circuit of this embodiment too, in the same way as with the high side circuit shown in FIG. 1, an advantage is obtained in that a delay in the action of turning on the high potential side switching element XD1 is suppressed, thus reducing power loss.

Third Embodiment

Next, a description will be given of a third embodiment of the invention.

The half bridge drive circuit 1 according to this embodiment is such that a signal with an output waveform different from that heretofore known is output from the pulse generator circuit 40 in the high side circuit 20 shown in FIG. 1 and FIG. 3.

Figure 4:
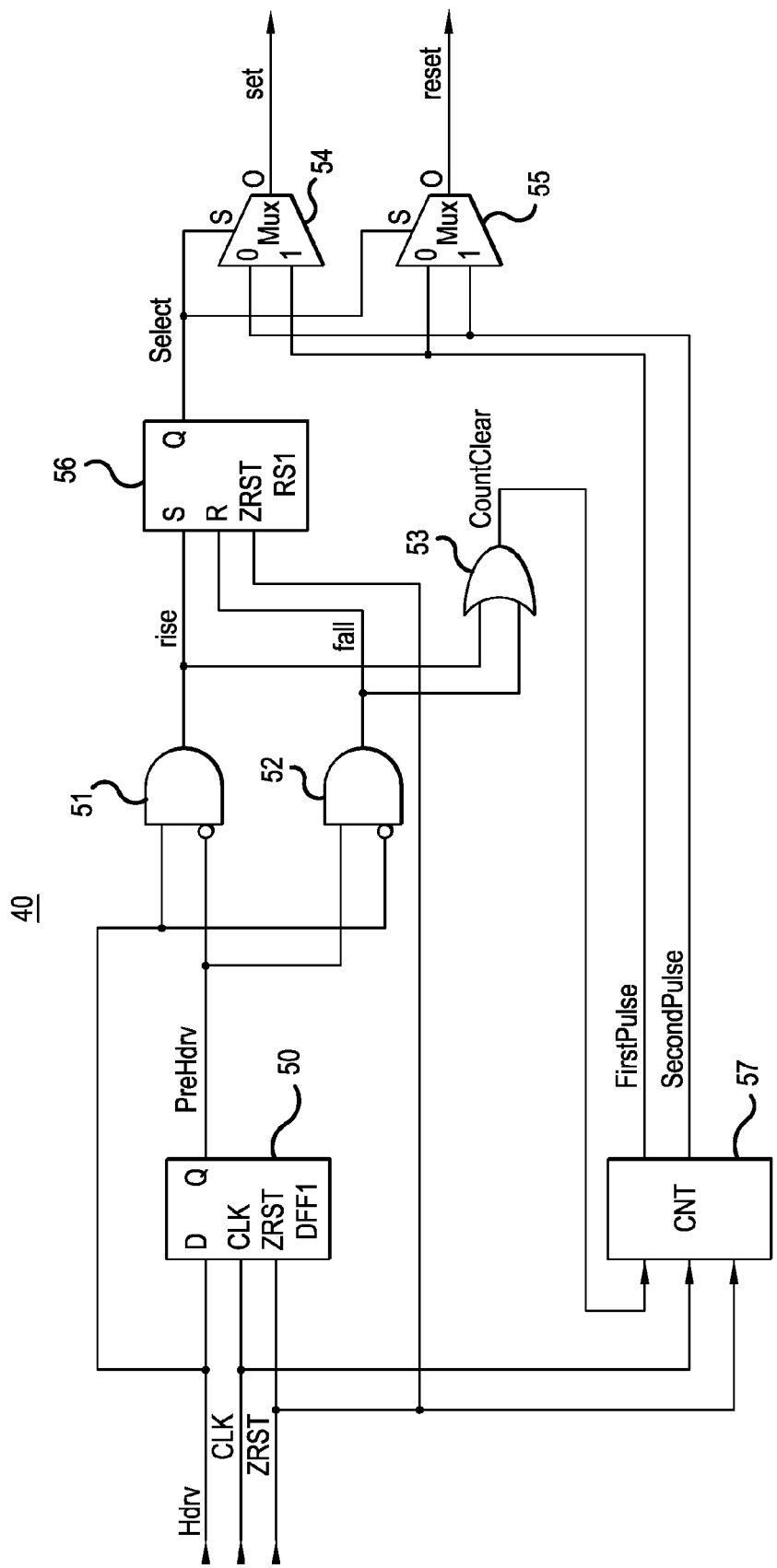
FIG. 4 is a circuit configuration diagram of a pulse generator circuit 40 according to a third embodiment of the invention.

FIG. 4 is a circuit configuration diagram of the pulse generator circuit 40 according to this embodiment. In FIG. 4, the input signal Hdrv from the exterior is input into a D input terminal of a D-type flip-flop 50 of the pulse generator circuit 40. A system clock CLK is input into a CLK terminal of the D-type flip-flop 50.

Also, a Q output terminal of the D-type flip-flop 50 is connected to an inverting input terminal of an AND circuit 51 and connected to a non-inverting input terminal of an AND circuit 52. The input signal Hdrv is connected to a non-inverting input terminal of the AND circuit 51 and connected to an inverting input terminal of the AND circuit 52. The inverting input terminal can be realized by inserting a NOT circuit in the stage before the non-inverting input terminal.

The output terminal of the AND circuit 51 is connected to an S input terminal of an RS flip-flop 56. The output terminal of the AND circuit 52 is connected to an R input terminal of the RS flip-flop 56.

An output Q of the RS flip-flop 56 is connected to select terminals S of multiplexer circuits (MUX) 54 and 55. The multiplexer circuits (MUX) 54 and 55 select and output the input signal of either one terminal of an input terminal 0 or input terminal 1 in response to a select signal (Select).

The outputs of the AND circuit 51 and AND circuit 52 are each connected to an input terminal of an OR circuit 53. The output terminal of the OR circuit 53 is connected to a clear terminal of a counter circuit (CNT) 57. Also, the system clock CLK is connected to a clock input terminal of the counter circuit 57. One output terminal of the counter circuit 57 (in the following description, this output terminal is referred to as a "first output terminal") is connected to the input terminal 1 of the multiplexer circuit 54 and the input terminal 0 of the multiplexer circuit 55. The other output terminal of the counter circuit 57 (in the following description, this output terminal is referred to as a "second output terminal") is connected to the input terminal 0 of the multiplexer circuit 54 and the input terminal 1 of the multiplexer circuit 55.

In this embodiment, the first output terminal of the counter circuit 57 outputs a signal that maintains an on-state from "1" to "7" counted up sequentially by a clock signal after a clear signal, and is in an off-state from "8" onward. The second output terminal of the counter circuit 57 outputs a signal that maintains an off-state from "1" to "5", is turned on between "6" and "7", and is subsequently turned off again.

That is, the second output terminal of the counter circuit 57 outputs a signal that is turned on five clocks later than the first output terminal, and is turned off simultaneously with the first output terminal. It is sufficient that this delay time is regulated so as to be a time such that, subsequently, the output signal from the first output terminal (in the following description, this output signal is referred to as the "first output signal") is always input into the latch circuit 23 earlier, even when passing through the turn-on signal side level shift circuit 24, turn-off signal side level shift circuit 25, and latch malfunction protection circuit 22. Also, the time for which the output signal from the second output terminal (in the following description, this output signal is referred to as the "second output signal") is in an on-state is regulated to a time such that the p-type channel MOS transistors PM1a and PM2a are reliably turned on.

Provided that the timing at which the second output signal is turned off is such that it is turned off simultaneously with the first output signal as a signal synchronized with the clock, as in the circuit diagram of FIG. 4, there is no problem. Alternatively, provided that it is possible to obtain a pulse width such that it is possible to secure a sufficient on-state time of the p-type channel MOS transistors PM1a and PM2a, the second output signal may be turned off earlier than the first output signal. That is, what is important is at what kind of timing a signal that is level-shifted, passes through the latch malfunction protection circuit, and is input into the latch circuit, is turned on and off. Consequently, the counter circuit 57 can be realized even when the timings of the first and second output signals are staggered to a degree.

A system reset signal ZRST is connected to a reset terminal of each flip-flop 50 and 56 and the counter circuit 57.

Figure 5:
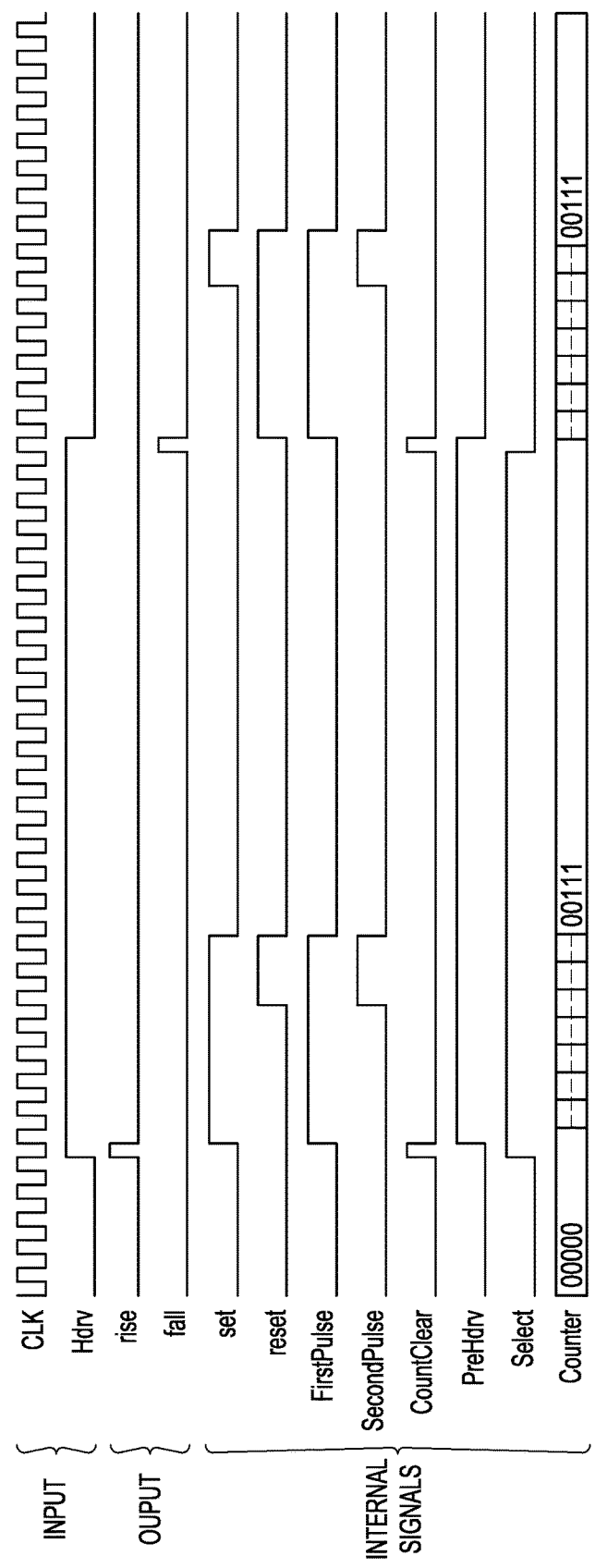
FIG. 5 is a timing chart for illustrating actions of the pulse generator circuit 40 of FIG. 4.

Operation waveforms of the pulse generator circuit 40 having the heretofore described configuration are shown in FIG. 5.

A signal PreHdrv is output by the D-type flip-flop 50 one clock later than the input signal Hdrv. The difference between the input signal Hdrv and the signal PreHdrv is picked up by the AND circuits 51 and 52, and a one clock rise signal and fall signal are output at the timings of a rise and fall respectively of the input signal Hdrv, forming a clear signal of the counter circuit 57.

Also, when the input signal Hdrv rises, the RS flip-flop 56 is set by the rise signal, and the output Q thereof changes to an H level. When the input signal Hdrv falls, the RS flip-flop 56 is reset by the rise signal, and the output Q thereof changes to an L level.

The multiplexer circuits 54 and 55 are such that the signal selected differs according to the rise and fall of the input signal Hdrv. Because of this, when the input signal Hdrv rises, the first output signal is output as a set signal from the multiplexer circuit 54, while the second output signal is output as a reset signal from the multiplexer circuit 55. Meanwhile, when the input signal Hdrv falls, the second output signal is output as a set signal from the multiplexer circuit 54, while the first output signal is output as a reset signal from the multiplexer circuit 55.

Figure 6A:
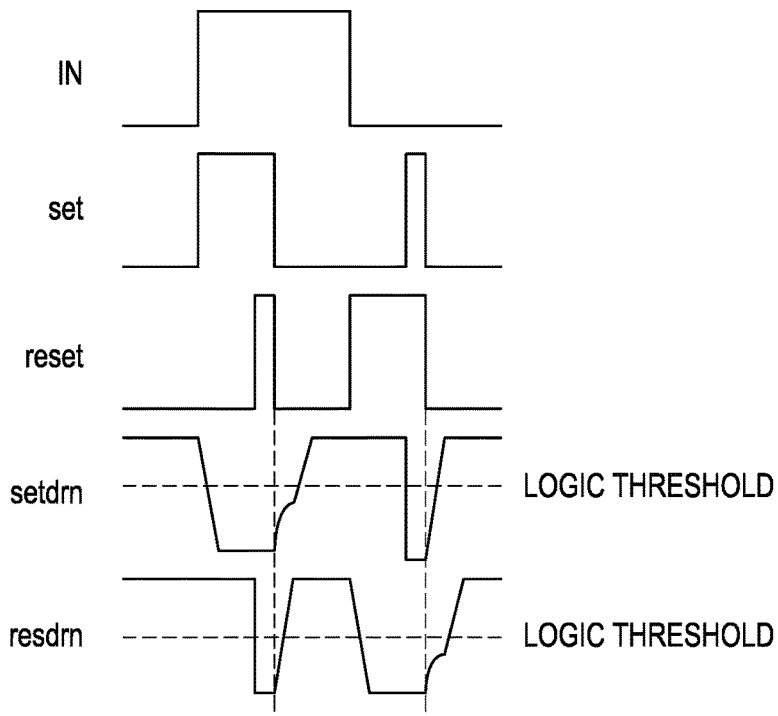
FIGS. 6A and 6B are an illustration of a level-shifted set signal and reset signal according to a pulse generating method of the third embodiment of the invention (FIG. 6A), and an illustration of a level-shifted set signal and reset signal according to a heretofore known pulse generating method (FIG. 6B)
Figure 6B:
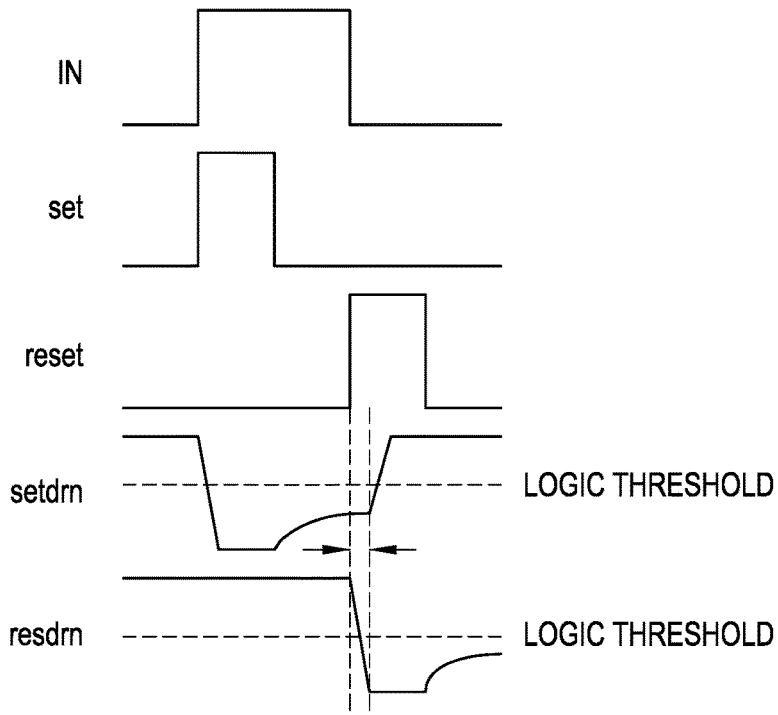

Next, using FIGS. 6A and 6B, a description will be given by comparing signals input into the latch malfunction protection circuit 22 according to waveforms of this embodiment with signals input into the latch malfunction protection circuit 22 according to waveforms of a previous embodiment.

The signals output from the pulse generator circuit 40 being as in FIG. 6A, the reset signal rises a predetermined time later than the set signal when setting, and the signals are turned off practically simultaneously. When resetting, firstly, the reset signal rises, the set signal rises a predetermined time later, and the signals are turned off practically simultaneously.

To describe in more detail, when setting, firstly, the set signal rises, at which time the reset signal is still in an off-state. The setdrn signal and resdrn signal (negative logic), which are signals after level-shifting, are at an L level and H level respectively, the latch circuit 23 takes on a set condition, and the output thereof is turned on. Consequently, the output of the high side driver 21 is also turned on, and the high potential side switching element XD1 takes on a conductive state. At this time, the latch malfunction protection circuit 22 is not operating.

Subsequently, on the reset signal rising a predetermined time (five clocks in the example of FIG. 4) later, the setdrn signal and resdrn signal (negative logic), which are signals after level-shifting, are both input into the latch malfunction protection circuit 22 at an L level (valid). Because of this, the protection function operates, and the output of the latch malfunction protection circuit 22 is at an H level on both the set side and reset side. On this being input into the latch circuit 23, the previous value is held, and the previous output is maintained. Because of this, the output of the high side driver 21 is at an H level, and the high potential side switching element XD1 maintains the conductive state.

As the output of the logical sum circuit OR1 is at an L level at this time, the p-type channel MOS transistors PM1*a* and PM2*a* are in an on-state. Because of this, the output impedance of the two level shift circuits 24 and 25 decreases, because of which the charging time of the parasitic capacitors Cds1 and Cds2 is shortened, and return is rapid.

Owing to the latch malfunction protection circuit 22, the impedance of the level shift circuit differs in accordance with the state of the output signal H0 of the high side driver 21. That is, when the output signal H0 is in an L level state, the setdrn side impedance is lower. Because of this, the setdrn signal recovers to an H level earlier. Because of this, stable action is possible, and when the set signal subsequently changes to an on-state, a swift response is possible. Meanwhile, when the output signal H0 is in an H level state, the resdrn side impedance is lower. Because of this, the resdrn signal recovers to an H level earlier. Because of this, stable action is possible, and when the reset signal subsequently changes to an on-state, a swift response is possible, and it is thus possible to drive the high potential side switching element XD1 at high speed.

Meanwhile, according to a heretofore known pulse generator circuit, the setdrn signal recovers to an H level simultaneously with the resdrn signal changing to an L level owing to the effect of the malfunction preventing p-type channel MOS transistors (PM1 and PM2), but a delay occurs, as shown in FIG. 6(*b*). During this, the subsequent stage latch malfunction protection circuit 22 operates, and the output signals do not change, because of which a delay occurs in output response.

In the second embodiment, the added logical sum circuit OR1 operates when dV/dt noise is generated, turning on the p-type channel MOS transistors (PM1 and PM2), and alleviating the delay when dV/dt noise is generated. In this embodiment, however, a condition in which the p-type channel MOS transistors (PM1*a* and PM2*a*) are simultaneously in an on-state is temporarily created by the H level periods of the set signal and reset signal overlapping for a certain period, thereby lowering the output impedance of the two level shift circuits. Because of this, it is possible to return the output status of the level shift circuits to a steady condition before the next control signal is input. Because of this, in this embodiment, it is possible to constantly alleviate the delay, regardless of whether dV/dt noise is generated.

Figure 7:
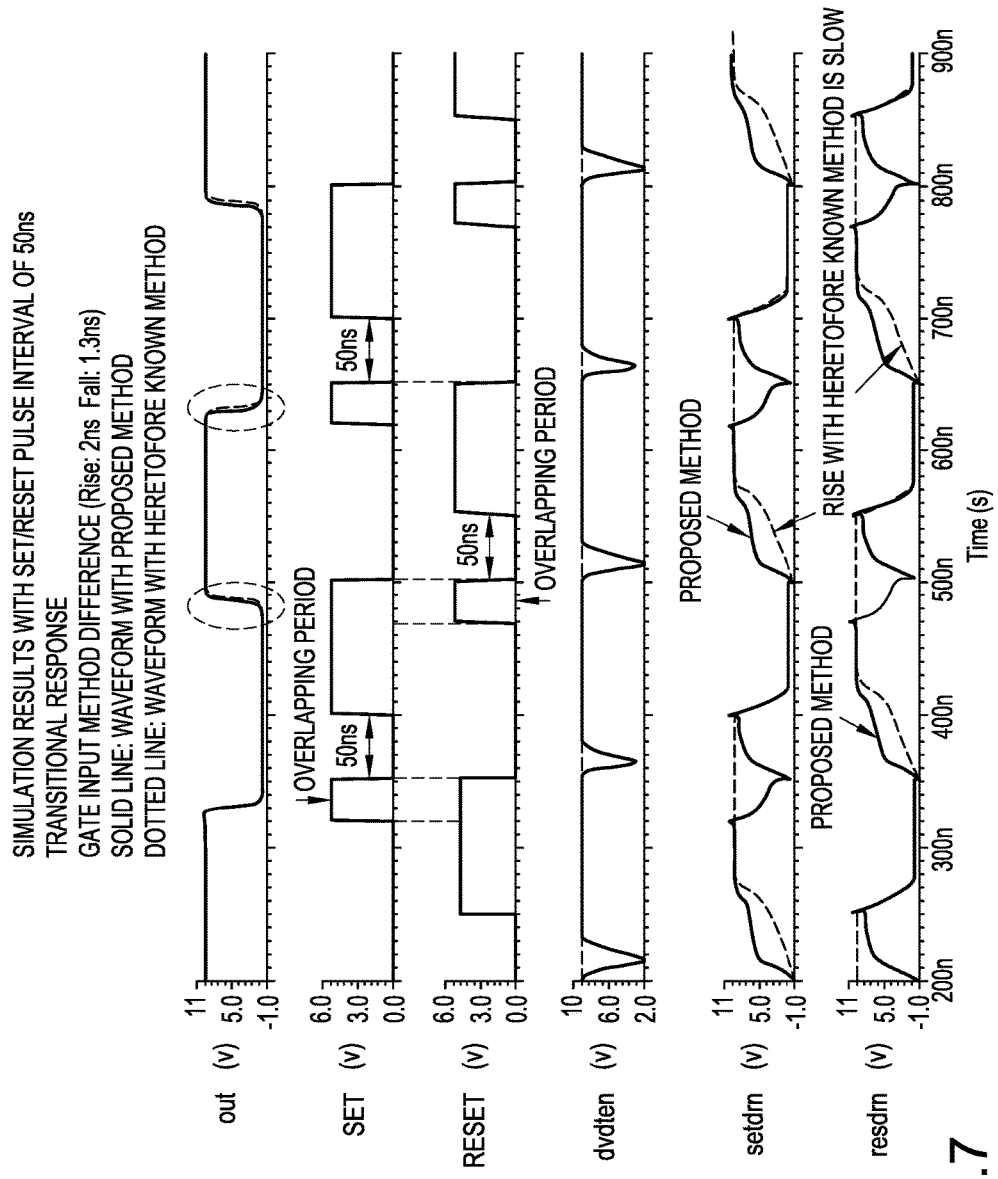
FIG. 7 is a diagram showing main signal simulation results when the pulse generator circuit of FIG. 4 is caused to operate (when the pulse interval is 50 ns)
Figure 8:
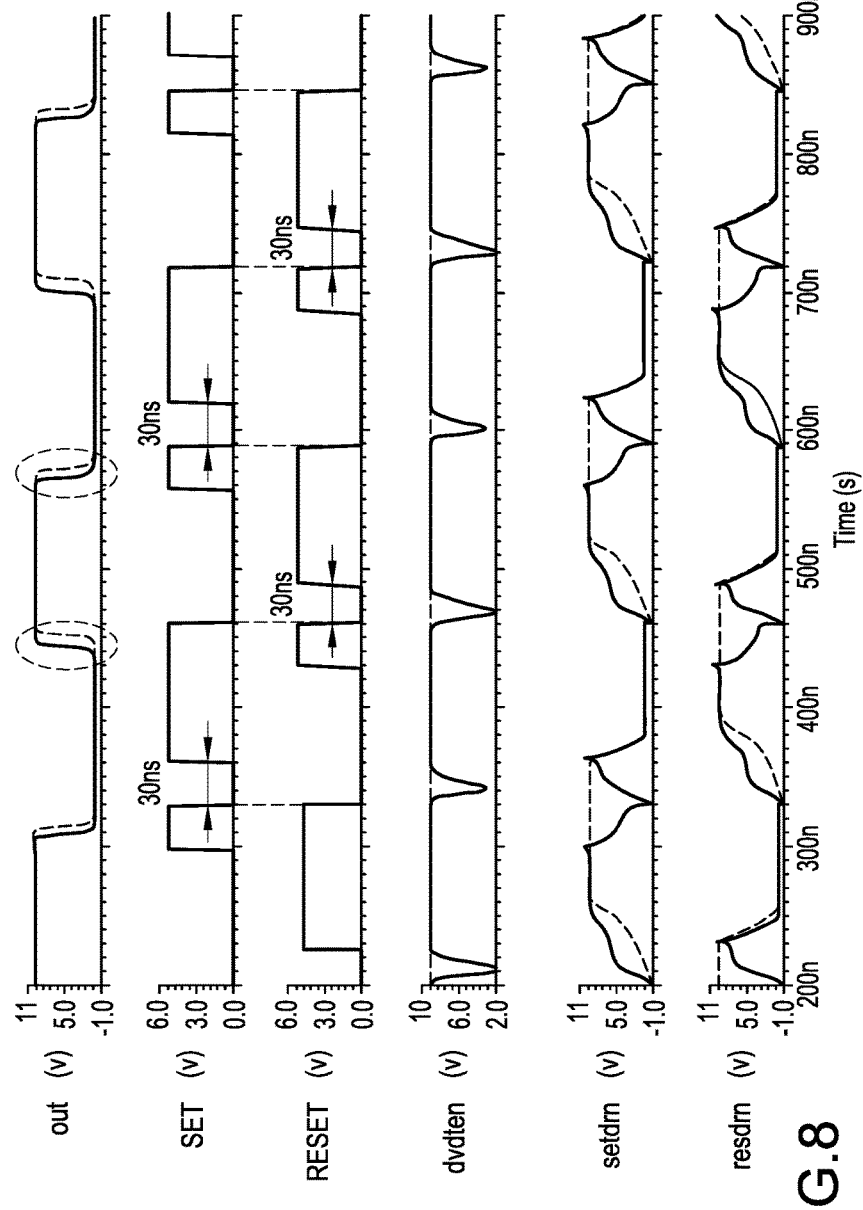
FIG. 8 is a diagram showing main signal simulation results when the pulse generator circuit of FIG. 4 is caused to operate (when the pulse interval is 30 ns)
Figure 9:
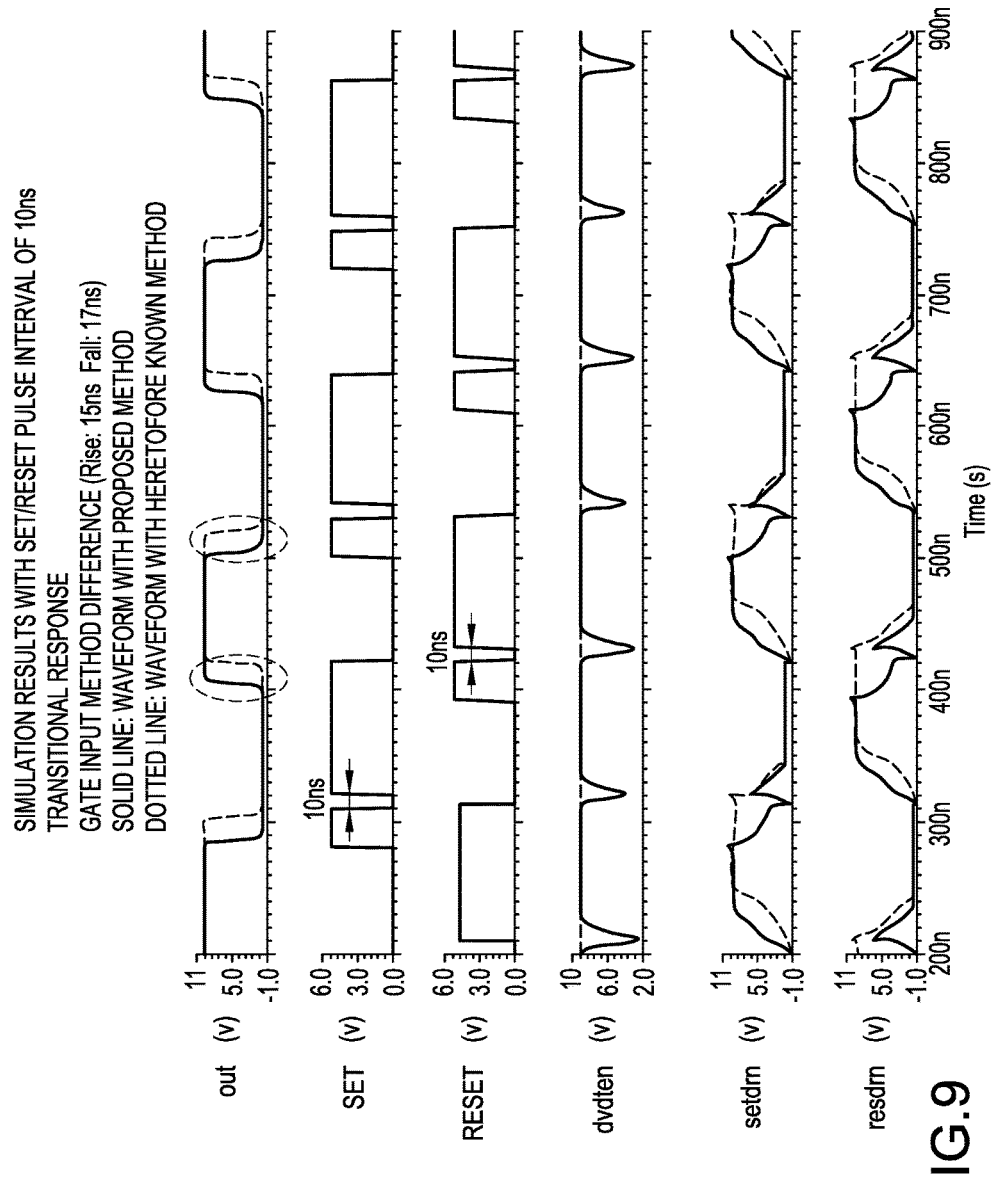
FIG. 9 is a diagram showing main signal simulation results when the pulse generator circuit of FIG. 4 is caused to operate (when the pulse interval is 10 ns)

FIGS. 7 to 9 show main signal simulation results when the pulse interval between the set signal and reset signal is 50 ns, 30 ns, and 10 ns respectively.

An output signal (out) from the high side driver 21, the set signal (set) and reset signal (reset), which are outputs of the pulse generator circuit 40, an output signal (dvdten) from the logical sum circuit OR1, the shifted set signal (setdrn), and the shifted reset signal (resdrn), are shown as the main signals. Waveforms when using the pulse generator circuit according to this embodiment are indicated by solid lines, while waveforms when using the heretofore known pulse generator circuit are indicated by dotted lines.

For example, in the example of FIG. 7 (the pulse interval of 50 ns), a delay alleviation effect of 2 ns when rising, 5.8 ns when falling, is obtained by using the pulse generator circuit according to this embodiment compared with when using the heretofore known pulse generator circuit. The shorter the pulse interval, the greater the effect, and in the example of FIG. 9 (the pulse interval of 10 ns), there is a delay alleviation effect of 15 ns when rising, 17 ns when falling.

What is claimed is:

1. A semiconductor device that transmits a primary side potential system input signal to a secondary side potential system differing from the primary side potential system, the semiconductor device comprising:

a high potential side switching element operating on a secondary side potential system control signal and a low potential side switching element operating on a primary side potential system control signal, connected in series, and power supply means having the potential of a connection point of the high potential side switching element and low potential side switching element as a reference;

a pulse generator that, based on the input signal, generates a pulse form set signal for putting the high potential side switching element into a conductive state and a pulse form reset signal for putting the high potential side switching element into a non-conductive state;

a first level shifter, in which a first resistor and first switching element are connected in series between a secondary side potential system high potential side power supply potential and a primary side potential system low potential side power supply potential, that provides the set signal as a gate signal of the first switching element, and obtains a secondary side potential system level-shifted set signal from a first connection point, which is a connection point of the first resistor and first switching element;

a second level shifter, in which a second resistor and second switching element are connected in series between the secondary side potential system high potential side power supply potential and primary side potential system low potential side power supply potential, that provides the reset signal as a gate signal of the second switching element, and obtains a secondary side potential system level-shifted reset signal from a second connection point, which is a connection point of the second resistor and second switching element;

a control signal output module that, based on the level-shifted set signal and level-shifted reset signal, outputs a control signal maintaining the high potential side switching element in a conductive state or non-conductive state;

a protection module provided in a stage prior to the control signal output means that, when the level-shifted set signal and level-shifted reset signal are provided simultaneously, provides a predetermined signal to the control signal output means such that the output of the immediately preceding control signal is continued;

a third switching element connected in parallel with the first resistor;

a fourth switching element connected in parallel with the second resistor; and a logical gate module, operating on the secondary side potential system, into which the potentials of the first and second connection points are input, wherein the logical gate module, when the potentials of the first and second connection points are both lower than the input threshold voltage of the logical gate module, puts the third and fourth switching elements into a conductive state.

2. The semiconductor device according to claim 1, further comprising a feedback module that pulls down the first connection point and pulls up the second connection point when the high potential side switching element is in a conductive state, and pulls up the first connection point and pulls down the second connection point when the high potential side switching element is in a non-conductive state.

3. The semiconductor device according to claim 1, wherein the pulse generator, while either one of the set signal or reset signal is in an on-state as a main pulse signal for putting the high potential side switching element into a conductive state or non-conductive state, turns on the other signal a certain time after the rise of the main pulse signal, thereby generating a condition in which the set signal and reset signal are both in an on-state.

* * * * *